US008064175B2

(12) United States Patent
Poulton

(10) Patent No.: US 8,064,175 B2
(45) Date of Patent: Nov. 22, 2011

(54) POWER SUPPLY SHUNT

(75) Inventor: John Wood Poulton, Chapel Hill, NC (US)

(73) Assignee: Rambus Inc., Sunnyvale, CA (US)

( * ) Notice: Subject to any disclaimer, the term of this patent is extended or adjusted under 35 U.S.C. 154(b) by 906 days.

(21) Appl. No.: 11/227,625

(22) Filed: Sep. 15, 2005

(65) Prior Publication Data

US 2007/0058306 A1 Mar. 15, 2007

(51) Int. Cl.
*H02H 9/00* (2006.01)

(52) U.S. Cl. .......................................................... 361/56

(58) Field of Classification Search ..................... 361/56
See application file for complete search history.

(56) References Cited

U.S. PATENT DOCUMENTS 4,958,093 A * 9/1990 Kosson et al. ................ 327/321
5,329,190 A * 7/1994 Igarashi et al. ............... 327/309
5,956,219 A * 9/1999 Maloney .......................... 361/56
6,127,840 A * 10/2000 Coteus et al. ................... 326/30
6,246,598 B1 * 6/2001 Tarter et al. ................ 363/56.01
6,356,427 B1 * 3/2002 Anderson ..................... 361/111
6,433,983 B1 * 8/2002 Fechner ........................ 361/111
6,784,048 B2 * 8/2004 Leung et al. .................. 438/239
6,803,680 B2 * 10/2004 Brindle et al. ................ 307/115
7,102,862 B1 * 9/2006 Lien et al. ....................... 361/56
7,250,660 B1 * 7/2007 Huang et al. .................. 257/355
7,397,641 B2 * 7/2008 Chu et al. ........................ 361/56
7,529,070 B2 * 5/2009 Bhattacharya et al. ......... 361/56
7,639,462 B2 * 12/2009 Graebel et al. .................. 361/56
7,724,485 B2 * 5/2010 Worley et al. ................... 361/56
7,782,580 B2 * 8/2010 Gauthier et al. ................ 361/56
2005/0040466 A1 * 2/2005 Arai et al. ..................... 257/362
2005/0068103 A1 * 3/2005 Dupuis et al. ................. 330/251
2005/0237681 A1 * 10/2005 Chen .............................. 361/56
2006/0092589 A1 * 5/2006 Bhattacharya et al. ...... 361/91.1

* cited by examiner

*Primary Examiner* — Jared Fureman
*Assistant Examiner* — Scott Bauer

(57) ABSTRACT

A power supply shunt for an electronic circuit. The power supply shunt includes at least two Field Effect Transistors (FETs), a first of the FETs having its drain coupled to a terminal of an electronic circuit and its source coupled to another of the FETs, and a second of the FETs having its source coupled to ground and its drain coupled to another of the FETs. The first FET has a bulk terminal that floats with respect to ground.

21 Claims, 6 Drawing Sheets

POWER SUPPLY SHUNT

BACKGROUND OF THE INVENTION

When an integrated circuit chip is being handled there is a danger that an electrostatic discharge (ESD) onto one or more of the chip's pins will damage the chip's circuitry. One way to reduce the possibility that an ESD will damage a chip is to incorporate "clamping circuitry" within the chip. The clamping circuitry is typically made up of a "voltage clamp" at each of the chip's pins (or "terminals"), with the exception of the ground pin(s). The clamp associated with a given pin is designed to divert ESD charge from the pin to ground or to the positive power supply. To prevent the voltage between the positive power supply and ground from becoming large enough to damage internal circuitry, a "power supply shunt" is placed between the positive supply and ground. The clamps and shunts operate together to prevent the voltage between any pair of terminals within the chip from exceeding a maximum allowed voltage.

When an integrated circuit chip is not being handled and is powered-up for operation, a termination voltage (Vtt) is typically applied to circuitry at each of the chip's input and output pins. The termination voltage is a power supply voltage associated with a terminator. The terminator, typically a resistive element with resistance equal to the characteristic impedance of the transmission line connected to the pin, is used to "absorb" signal reflections from impedance discontinuities in the transmission line at a transmitting pin, and to prevent reflections from signals at a receiving pin. Accordingly, the clamp and shunt elements must be able to safely withstand the termination voltage that is applied when the chip is in operation.

BRIEF DESCRIPTIONS OF THE DRAWINGS

The following detailed description, given by way of example, but not intended to limit the invention solely to the specific embodiments described, may best be understood in conjunction with the accompanying drawings wherein like reference numerals denote like elements and parts, in which.

DETAILED DESCRIPTION

Many current high-performance serial links are fabricated using thin-oxide devices. That is, Insulated Gate Field Effect Transistors (IGFETs) that employ a thin layer of oxide as an insulator between the gate layer, typically fabricated from poly-crystalline silicon, and the semiconductor layer. Such thin-oxide devices require a combination of ESD clamps and power supply shunts to protect them from ESD events.

It should be noted that FETs employed in various embodiments of the present invention may be Metal Oxide Semiconductor Field Effect Transistors (MOSFETs) or other types of Insulated Gate Field Effect Transistors (IGFETs). Moreover, it should also be noted that the term "MOSFET" was originally applied to FETs in which the gate terminal was constructed from a metal (e.g., aluminum), and the insulator was silicon dioxide. However, the term "MOSFET" has evolved to also denote FETs which use other materials for the gate terminals and/or the insulator. For example, FETs that employ gate terminals using polycrystalline silicon are typically referred to as MOSFETs. Also, FETS in which the insulator is made from a material having a high dielectric constant ("K") (i.e. a material having a K value that is approximately equal to or greater than the K value of silicon dioxide) are also referred to as MOSFETs. Accordingly, the term MOSFET as used in this document is not limited to IGFETs employing silicon dioxide insulators. The transistors employed in embodiments of the present invention may be MOSFETs employing metal gate terminals and silicon dioxide insulators, MOSFETs employing polycrystalline silicon in their gate terminals, MOSFETs employing high dielectric constant materials (i.e. materials having a dielectric constant greater than that of silicon dioxide) in their insulators, and other IGFETs.

It should be further noted that the thinness of the gate oxide (i.e. insulator) in a "thin oxide" device varies according to the process in which the device is fabricated. Thus, a thin-oxide device may be said to be a device having gate oxide layer of a thickness that is equal to, or approximately equal to, the smallest thickness achievable by the process used to fabricate the device.

In any event, high-performance serial links that must interoperate with legacy devices require a termination voltage (Vtt) that is much higher than is typically used as the positive power supply voltage (typically referred to as "Vdd") for thin-oxide devices. Accordingly, any power supply shunt designed for use in such serial links must be able to withstand the high termination voltage during normal chip operation.

Figure 1:
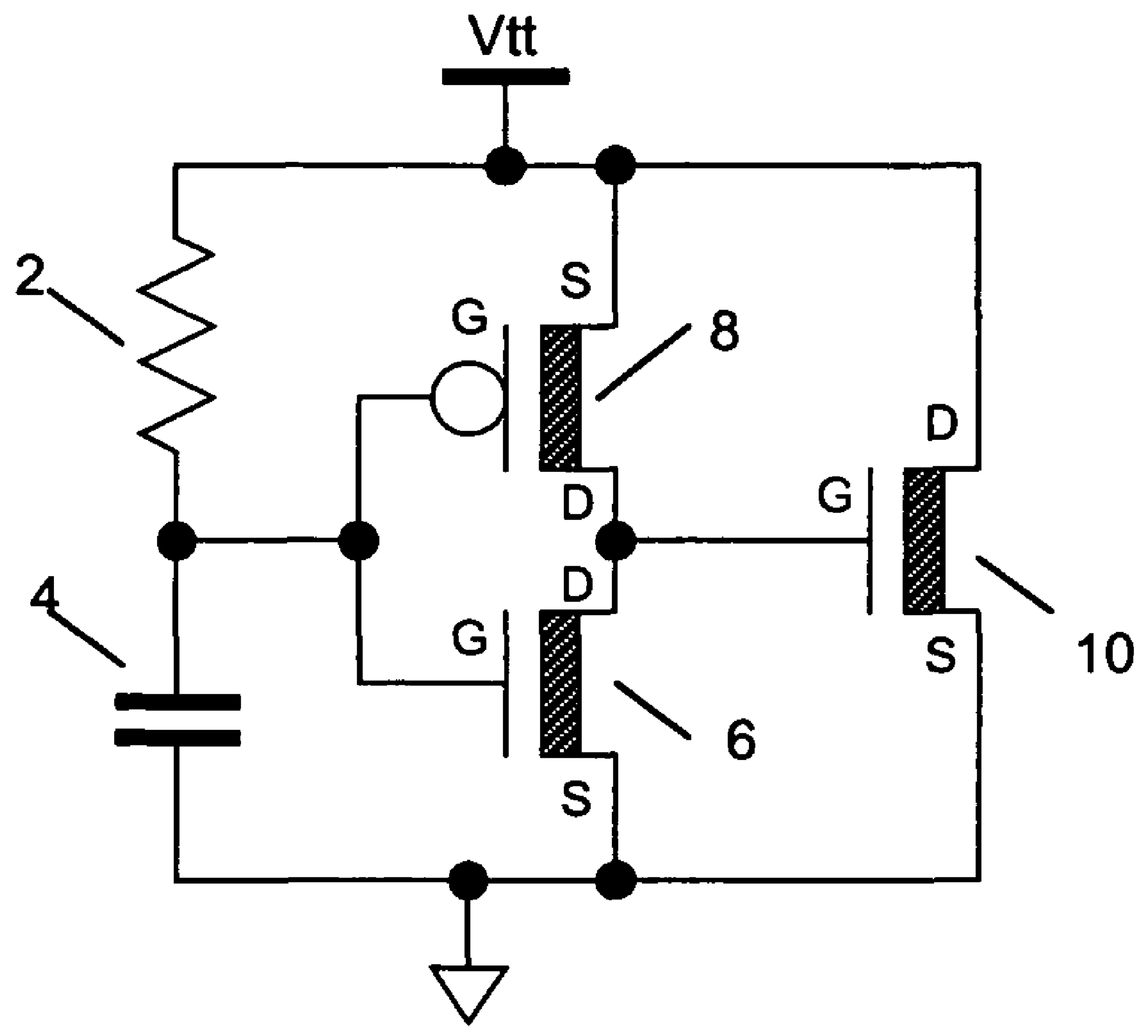
FIG. 1 is a circuit diagram of a power supply shunt employing a thick-oxide Field Effect Transistor (FET) to direct charge imparted by an ESD event from a positive power supply terminal, here denoted as Vtt, to ground.

One type of power supply shunt having the desired characteristics to work in chips which employ thin-oxide-device(s) and which must interoperate with legacy devices requiring higher termination voltages than those typically used for thin-oxide devices, is a shunt built using a thick-oxide device. FIG. 1 is a circuit diagram of a power supply shunt employing a thick-oxide FET. As can be seen, the circuit includes a resistor 2, a capacitor 4 and three MOSFETs 6, 8 and 10. MOSFETS 6 and 10 are n-channel MOSFETs (NFETs), while MOSFET 8 is a p-channel MOSFET (PFET), and each has a gate, source and drain terminal, labeled respectively as "G," "S" and "D."

In describing the operation of FIG. 1, and throughout this description, the terms "high," "low, " "on," "off," "short circuit" and "open circuit" should be understood to describe relative conditions as understood by one skilled in the art of electronics. For example, the term "short circuit" may refer to the theoretically ideal short circuit as well as to an imperfect short circuit.

Further, in describing the operation of FIG. 1, and throughout this description, all FETs without an inversion symbol at their gate inputs are n-channel FETs unless otherwise indicated, and all FETs having an inversion symbol at their gate inputs are p-channel FETs unless otherwise indicated. Still further, it should be noted that FETs discussed herein are symmetrical with respect to their drains and sources. That is, each of the FETs discussed herein may have its drain and source connections interchanged without affecting operation of the circuit in which the FET is being used.

The circuit depicted in FIG. 1 may be incorporated within an integrated circuit chip. When such a chip is in a steady state operating condition, capacitor 4 is charged to the termination voltage Vtt such that the voltage at the gates of transistors 6 and 8 is high. The high voltage at the gate of transistor 6 means that transistor 6 is in the "on" state, which results in a low voltage between the source and drain of transistor 6. Thus, there is a low voltage at the gate of transistor 10, and transistor 10 is in the "off" state, creating an "open" circuit between the source and drain of transistor 10. The high voltage at the gate of transistor 8 means that transistor 8 is in the "off" state, since the gate voltage of transistor 8 is inverted.

If the chip is powered-down, there is no voltage on the Vtt terminal. If the chip is then handled in the powered-down state and an ESD causes a voltage spike on the Vtt terminal, transistor 10 "shorts" the current associated with the event to ground, thereby quickly dissipating the excess charge associated with the event and limiting to a safe value the voltage excursion between the Vtt supply terminal and ground. More particularly, in the powered-down state, capacitor 4 is discharged, and thus the voltage on the gates of transistors 6 and 8 is low. Accordingly, transistor 6 is off and transistor 8 is on. The effect is that the gate of transistor 10 is decoupled from ground due to the "open circuit" between the source and drain of transistor 6 and is coupled to the high voltage caused by the ESD pulse due to the "short circuit" between the source and drain of transistor 8. Since the gate of transistor 10 is at a high voltage, transistor 10 is on, effectively shorting any charge on the Vtt terminal to ground through its drain-source path. Thus, the charge associated with an ESD event occurring on the Vtt terminal during power-down is shorted to ground via transistor 10.

There is little charging of capacitor 4 during the ESD event, a condition which is insured by use of a resistor 2 and capacitor 4 that have an "rc time constant" that is much greater than the duration of an average ESD event. When the chip is powered-up, the rate at which the Vtt power supply can ramp up the voltage between Vtt and ground is slower than the rc time constant of resistor 2 and capacitor 4. Therefore the voltage at the gates of transistors 6 and 8 is at or near the voltage on Vtt, and transistor 6 remains on while transistor 8 remains off. Transistor 10, in turn, remains off by virtue of its gate voltage that is maintained at or near ground by conduction through transistor 6.

In the FIG. 1 circuit, transistor 10 is a thick-oxide device, specifically a thick-oxide NFET. Although in current thick-oxide devices, the thickness of the oxide layer ranges approximately between 30 and 60 angstroms, it should be understood that the terms "thick-oxide device" and "thin-oxide device" are well understood in the art of present invention, and that those skilled in the art can readily distinguish between a "thick-oxide device" and a "thin-oxide device," even as the technology related to both types of devices continues to advance. Further, it is noted that in some embodiments a thick-oxide device has a supply voltage that is ≧1.5 times larger than the supply voltage for a thin-oxide device.

A thick-oxide device is used in the operation of the FIG. 1 circuit to clamp the Vtt terminal to a level that is safe for thin-oxide devices and to enable the circuit to withstand application of a high termination voltage at the Vtt terminal. However, in order to clamp the voltage on the Vtt terminal at or near its nominal value during an ESD, the thick-oxide NFET 10 of FIG. 1 requires a very large area.

Figure 2:
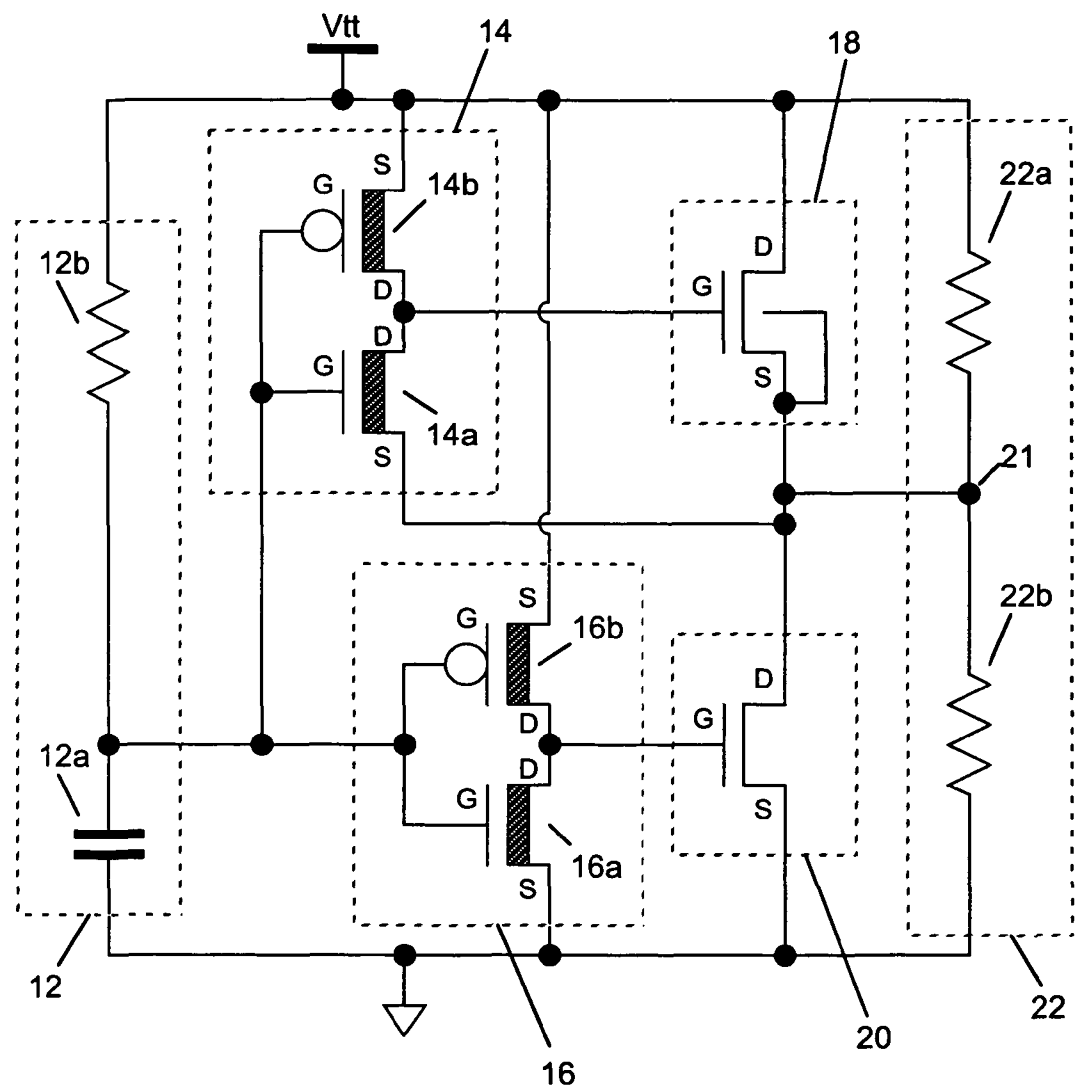
FIG. 2 is a circuit diagram of a power supply shunt employing a stacked structure of thin-oxide n-channel FETs to direct charge imparted by an ESD event from the positive supply to ground.

The circuit depicted in FIG. 2 is a power supply shunt that uses thin-oxide devices to conduct ESD charge to ground. The power supply shunt of FIG. 2 meets or exceeds the clamping and voltage tolerance characteristics of thick-oxide based clamps like that of FIG. 1 in a smaller overall layout area. FIG. 2 shows such a thin-oxide based clamp. In current thin-oxide devices fabricated using 90-namometer CMOs technology, the thickness of the oxide layer is approximately 20 angstroms or less.

Referring to FIG. 2, there is shown a circuit diagram of a power supply shunt that uses thin-oxide FETs to conduct charge from an ESD event to ground. The circuit of FIG. 2 may be incorporated within an integrated circuit chip. The power supply shunt of FIG. 2 includes an rc circuit 12, a first inverter 14 a second inverter 16, a first shunting FET 18, a second shunting FET 20, and a resistor network 22. Both first and second inverters 14 and 16 are composed of thick-oxide FETs, while the shunting FETs 18 and 20 are thin-oxide devices.

The resistor network includes resistors *22a* and *22b*. The values of resistors *22a* and *22b* are chosen so as to insure that at power-up and in the steady state the voltage at a node 21 coupling resistor *22a* to *22b* is Vtt/2. That is, the voltage across each of resistors *22a* and *22b* is Vtt/2. In this manner, resistor network 22 insures that the voltage at the drain of transistor 20 is Vtt/2. Of course, all of the target voltages mentioned may be approached without being precisely achieved. For example, while the target for the voltage between the source of transistor 18 and the drain of transistor 20 is Vtt/2, the actual voltage achieved may vary somewhat from Vtt/2 due to imperfections in circuit components, etc.

It is important to note that even without the benefit of resistor network 22, the voltage at the drain of transistor 20 may be exactly Vtt/2 or about Vtt/2. Indeed, without the resistor network, the apportionment of Vtt across transistors 18 and 20 will be inversely proportional to the drain-source leakage conductance of the respective transistors. For example, if the drain-source leakage conductance of transistor 20 is twice that of the drain-source leakage conductance of transistor 18, and all other conditions are equal, the voltage across the drain-to-source of transistor 20 will be Vtt/3 and the voltage across the drain-to-source of transistor 18 will be 2Vtt/3; and if the leakage conductances are equal, the voltage across each transistor will be Vtt/2. Thus, the resistor network merely provides insurance that the voltage at the drain of transistor 20 is Vtt/2 or about Vtt/2 in the event that there is a significant disparity in leakage conductances. Accordingly, inclusion of the resistor network is a preferred option. Further, it is preferable that resistors *22a* and *22b* have resistance values of 50 Kohms or higher.

In the steady state operation of the circuit of the FIG. 2, capacitor *12a* is charged to the termination voltage Vtt such that the voltage at the gates of transistors *14a*, *14b*, *16a* and *16b* is high. The high voltage at the gates of transistors *14a* and *16a* means that transistors *14a* and *16a* are in the "on" state, which results in a low voltage between the source and drain of for each of transistors *14a* and *16a*. Thus, there is a low voltage between the gates of transistors 18 and 20 and their respective sources, and transistors 18 and 20 are in the "off" state, creating "open" circuits between the source and drain of transistor 18 and between the source and drain of transistor 20. The high voltage at the gates of transistors *14b* and *16b* means that transistors *14b* and *16b* are in the "off" state, since the gate voltages of transistors *14b* and *16b* are inverted.

In the steady state operation, a practical implementation of the circuit of FIG. 2 consumes about 20-40 micro amps of current.

If a chip having the circuit of FIG. 2 is powered-down, there is no voltage on the Vtt terminal. If the chip is then handled in the powered-down state and an ESD causes a voltage spike on the Vtt terminal, transistors 18 and 20 conduct the charge associated with the event to ground, thereby quickly dissipating the excess voltage associated with the event. More particularly, when the chip is powered-down capacitor 12*a* is discharged; thereby the voltage on the gates of transistors 14*a*, 14*b*, 16*a* and 16*b* is low. Accordingly, transistors 14*a* and 16*a* are off and transistors 14*b* and 16*b* are on. The effect is that: the gate of transistor 18 is decoupled from the node 21 between the coupling of resistor 22*a* to 22*d* due to the "open circuit" between the source and drain of transistor 14*a*; the gate of transistor 20 is decoupled from ground due to the "open circuit" between the source and drain of transistor 16*a*; the gate of transistor 18 is coupled to a high voltage caused by the ESD pulse due to the "short circuit" between the source and drain of transistor 14*b*; and the gate of transistor 20 is coupled to a high voltage caused by the ESD pulse due to the "short circuit" between the source and drain of transistor 16*b*. Since the gates of transistors 18 and 20 are at a high voltage, transistors 18 and 20 are on, effectively creating a low-impedance path between the Vtt terminal and ground through the path from the drain of transistor 18 to the source of transistor 20. Thus, the charge associated with the ESD event is "shorted" to ground via transistors 18 and 20.

There is little charging of capacitor 12*a* during the ESD event, a condition which is insured by use of a resistor 12*b* and capacitor 12*a* that have an "rc time constant" that is much greater than the duration of the average ESD event. When the chip is once again powered-on, the capacitor charges to Vtt, the voltage on the gates of transistors 14*a*, 14*b*, 16*a* and 16*b* go high again, and the circuit returns to the steady state. Little or no current flows through the series combination of transistors 18 and 20 during a power-up event, because the rc time constant of resistor 12*b* and capacitor 12*a* is much shorter than the time required for a power supply to ramp up the voltage between Vtt and ground.

A significant advantage of the FIG. 2 circuit is realized by splitting the steady state Vtt voltage between transistors 18 and 20. In particular, the Vtt voltage is divided evenly or approximately evenly, between transistors 18 and 20, thereby preventing a significant majority of the voltage from appearing across one of the transistors. In this manner, the Vtt tolerance requirement for each of the transistors is reduced. Indeed, the Vtt tolerance required from each of transistors 18 and 20 is halved, or approximately halved, with respect to the Vtt tolerance required of transistor 10 in FIG. 1—all other conditions being equal.

Since the burden of Vtt is shared between transistors 18 and 20, it is possible to use thin-oxide devices as transistors 18 and 20 while meeting the requirements of clamping the Vtt terminal to a level that is safe for thin-oxide devices, having a high ESD current tolerance, and having a high Vtt voltage tolerance. In a preferred embodiment, transistors 18 and 20 are thin-oxide NFETs.

In order to achieve the same clamping voltage as the stacked thin-oxide configuration of FIG. 2, the thick-oxide transistor of FIG. 1 would consume about twice the area. Accordingly, the FIG. 2 power supply shunt can achieve the same overall performance of the FIG. 1 power supply shunt while occupying about half the area of the FIG. 1 power supply shunt.

A simulation of the FIG. 2 circuit, implemented in a typical 90-nanometer CMOS process, was conducted. The simulation indicated that the stacked thin-oxide power supply shunt of FIG. 2 is able to hold a Vtt terminal to within 1.15 volts while the terminal experiences a 2 KV Human Body Model (HBM) ESD event. The simulation also indicated that a thick-oxide power supply shunt that requires about the same area as the stacked thin-oxide power supply shunt was only able to hold the Vtt terminal to within 1.6 volts for the same 2 KV HBM ESD event.

It is important to note that in order for the FIG. 2 configuration to function properly, the substrate or "bulk terminal" of transistor 18 must be at substantially the same voltage as the source of transistor 18. Therefore, the source, drain, and channel regions of the transistor must be isolated from the chip substrate. In cases where the substrate is grounded, it can be said that the source, drain, and channel regions of the transistor must be "floating with respect to ground." Such condition is necessary so that at high Vtt voltage levels the full Vtt voltage is not applied between the source and bulk of transistor 18. If the source, drain, and channel regions of the transistor were not isolated from the chip substrate, transistor 18 would have to bear the entire Vtt voltage between its source and bulk terminals. Since the stacked thin-oxide configuration of FIG. 2 is designed to operate by having transistors 18 and 20 share any Vtt voltage, allowing one of the transistors to bear the entire voltage would defeat the purpose of the FIG. 2 design. Several transistor types are suitable for use as transistor 18. Preferably, transistor 18 is an NFET positioned in a deep n-well.

Figure 3:
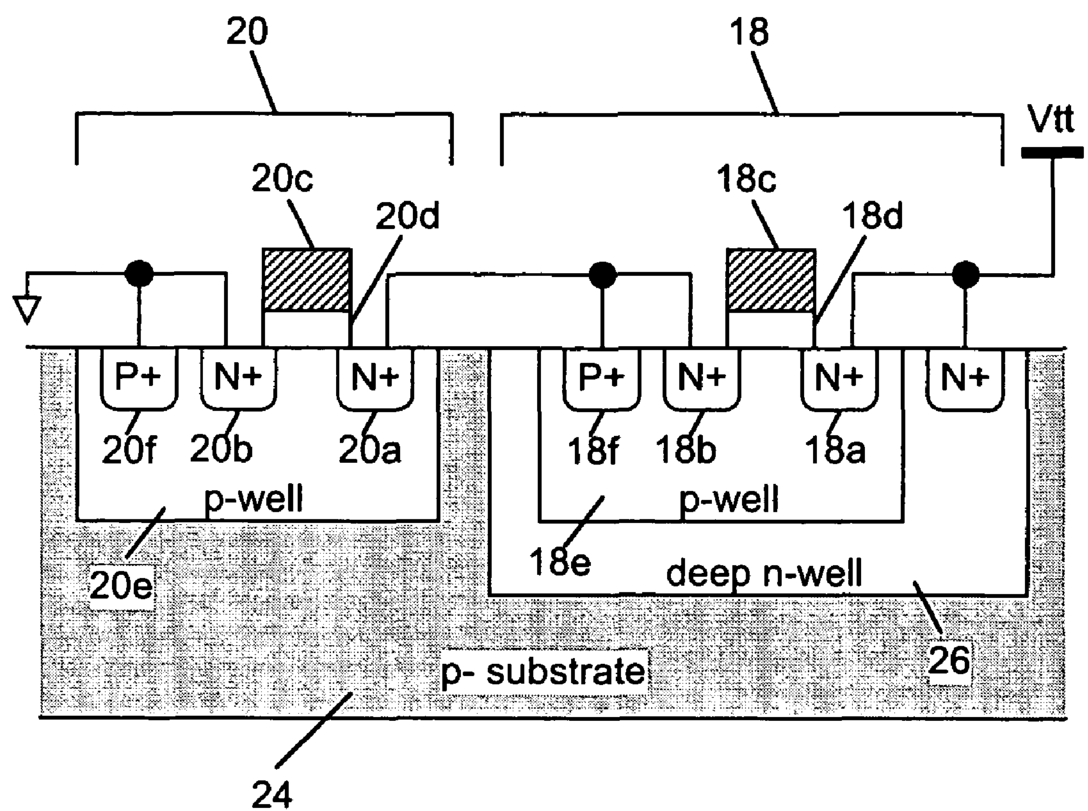
FIG. 3 shows a cross-sectional view of a pair of transistors that may be used to implement transistors 18 and 20 of FIG. 2.

FIG. 3 shows the cross-sectional view of a pair of transistors that may be used to implement transistors 18 and 20 of FIG. 2. In the embodiment depicted in FIG. 2, transistors 18 and 20 are formed in/on a single p-type substrate 24, transistor 18 is an NFET that is formed within a deep n-well 26, and transistor 20 is an NFET that is not formed within a deep n-well. The deep n-well is used to isolate transistor 18 from the grounded chip substrate 24. Transistor 18 includes an n-type drain contact 18*a*, an n-type source contact 18*b*, and a gate contact 18*c* positioned above a thin oxide layer 18*d*. The drain and source contacts are positioned within a "bulk terminal," p-well 18*e*, which includes a p-type contact 18*f*. Transistor 20 has the same configuration as transistor 18. Transistor 20 includes: an n-type drain contact 20*a*, an n-type source contact 20*b*, a gate contact 20*c* positioned above a thin oxide layer 20*d* (layer 20*d* may or may not be formed in the same semiconductor processing step as layer 18*d*), and a "bulk terminal," p-well 20*e*, having a contact 20*f*. Of course, transistor 20 could also be positioned in a deep n-well, although such condition is not necessary for the proper operation of the power supply shunt.

Figure 4:
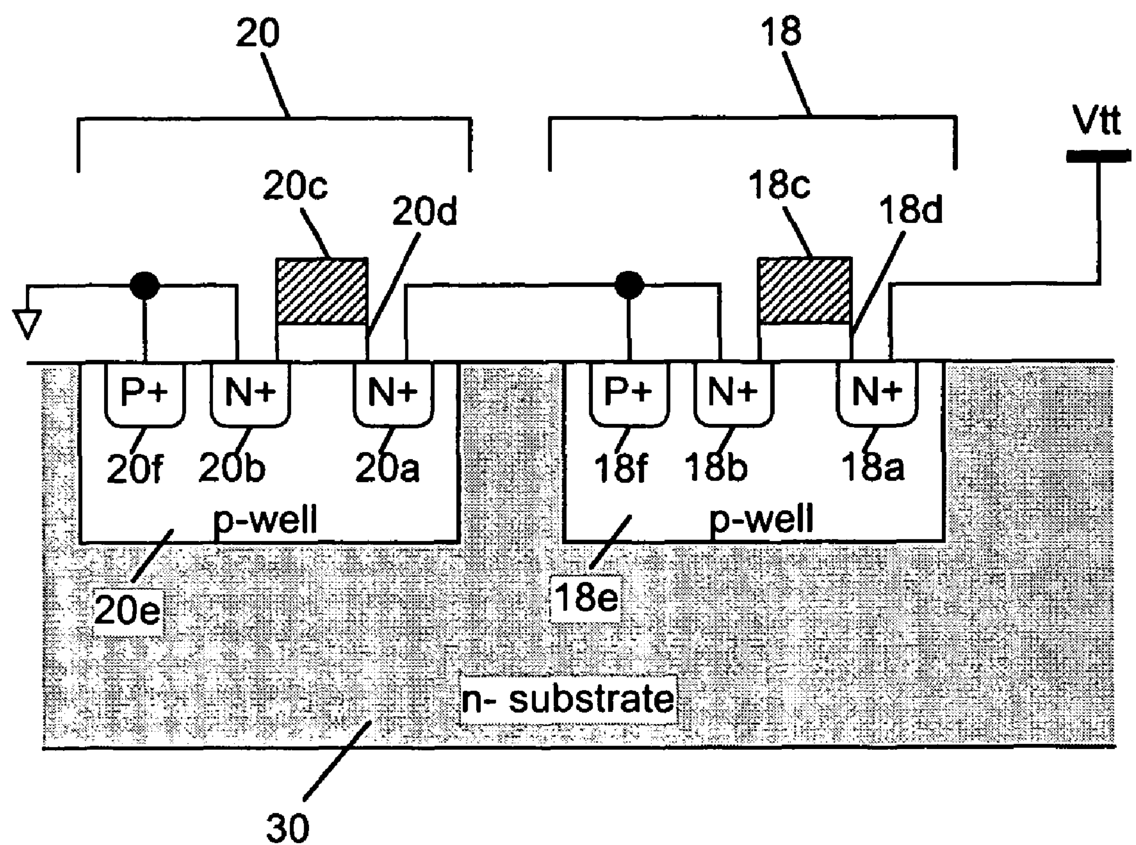
FIG. 4 shows an alternative cross-sectional view of a pair of transistors that may be used to implement transistors 18 and 20 of FIG. 2.

FIG. 4 shows an alternative embodiment of a pair of transistors that may be used to implement transistors 18 and 20 of FIG. 2. The embodiment of FIG. 4 is similar to that of FIG. 3, with the exceptions that the transistors are situated in/on an n-type substrate 30 and the deep n-well 26 of FIG. 3 is absent. In the FIG. 4 embodiment, the n-type substrate 30 provides the necessary isolation of transistor 18 from ground.

Figure 5:
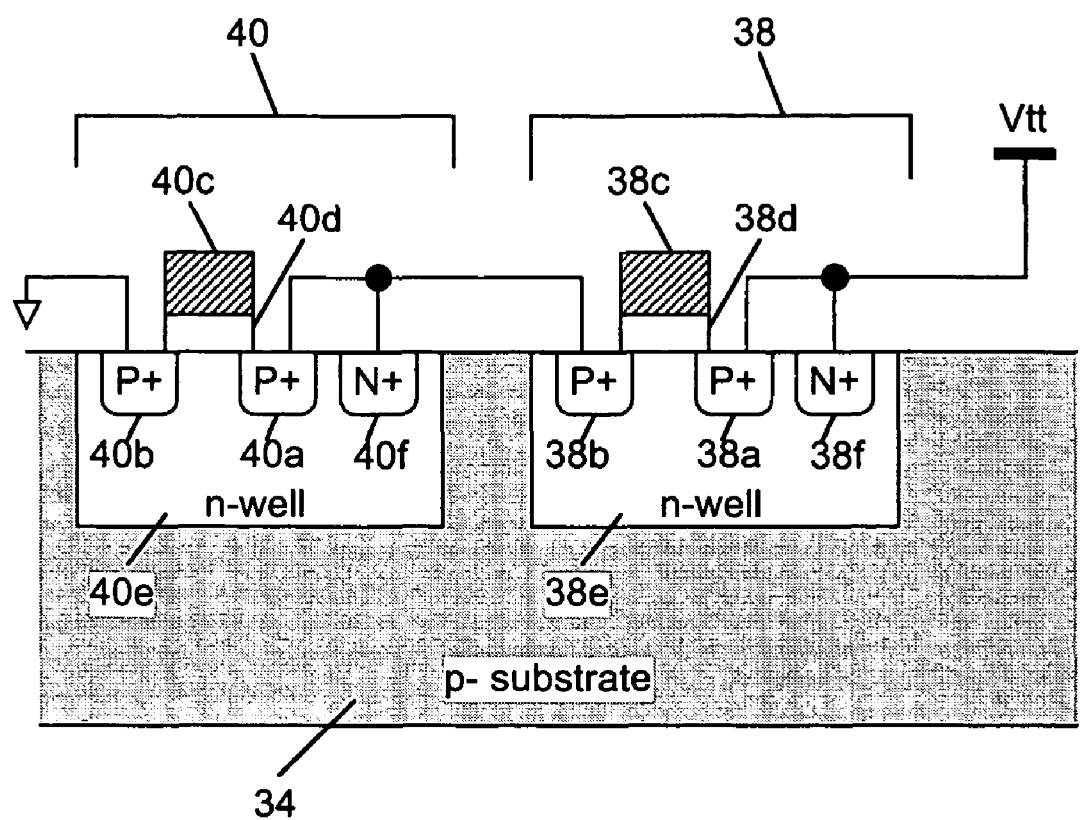
FIG. 5 shows another alternative cross-sectional view of a pair of transistors that may be used to implement transistors 18 and 20 of FIG. 2.

FIG. 5 shows another alternative embodiment of a pair of transistors that may be used to implement transistors 18 and 20 of FIG. 2. In FIG. 5, transistor 38 corresponds to transistor 18 of FIG. 2 and transistor 40 corresponds to transistor 20 of FIG. 2. As can be seen from FIG. 5, transistors 38 and 40 are p-channel FETs (PFETs). The two transistors are formed in/on a single p-type substrate 34. Transistor 38 includes a p-type drain contact 38*b*, a p-type source contact 38*a*, and a gate contact 38*c* positioned above a thin oxide layer 38*d*. The drain and source contacts are positioned within an n-well 38*e*, which includes an n-type contact 38*f*. Transistor 40 has the same configuration as transistor 38. Transistor 40 includes: a p-type drain contact 40*b*, a p-type source contact 40*a*, a gate contact 40*c* positioned above a thin oxide layer 40*d*, and an n-well 40*e* having an n-type contact 40*f*.

Notably, when the FIG. 5 embodiment is employed as transistors 18 and 20 of FIG. 2, the positions of capacitor 12*a* and resistor 12*b* must be reversed for proper operation of the power supply shunt. The positions of all other circuit elements may remain the same.

Returning now to FIG. 2, it should be noted that the invention may be implemented with more than two thin-oxide transistors being used to clamp the Vtt terminal to ground. That is, the stacked thin-oxide configuration, illustrated by transistors 18 and 20 in FIG. 2, may include three or more thin-oxide devices. By way of example, a stacked structure that includes three thin-oxide transistors will be described in more detail.

Figure 6:
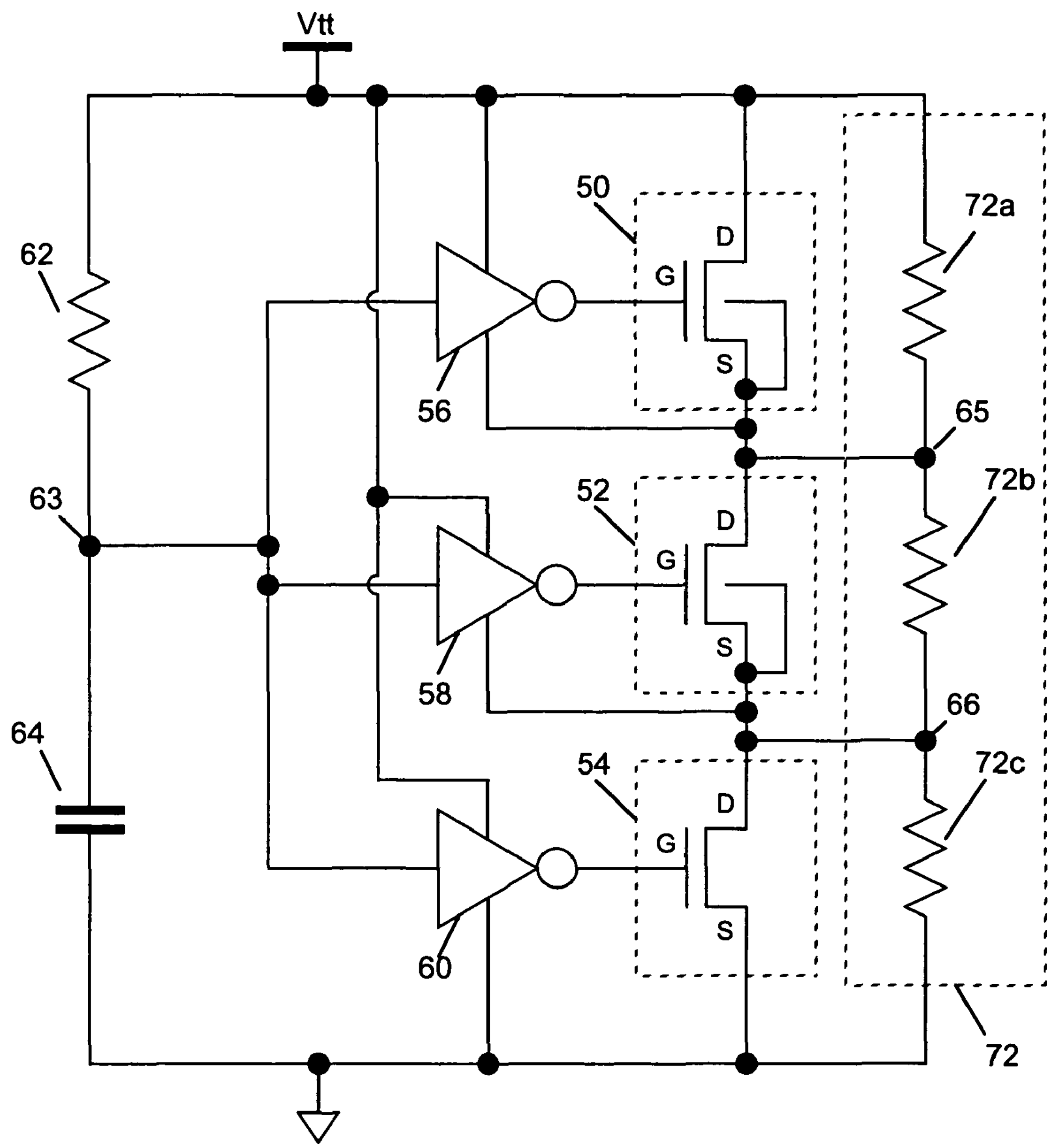
FIG. 6 is a circuit diagram of a power supply shunt employing a stacked structure of three thin-oxide FETs to direct charge imparted by an ESD event from a positive power supply to ground.

FIG. 6 shows a power supply shunt employing a stacked structure that includes three thin-oxide FETs, 50, 52 and 54. FETs 50, 52 and 54 are preferably NFETs. The gates of FETs 50, 52 and 54 are respectively coupled to the outputs of inverters 56, 58 and 60. The inputs to each inverter are coupled to a node 63 in a series connection between a resistor 62 and capacitor 64. Inverters 56, 58, and 60 are formed with thick-oxide transistors, while clamping devices 50, 52, and 54 are thin-oxide transistors.

Notably, the substrates of thin-oxide transistors 50 and 52 are floating. In other words, the "bulk terminals" of transistors 50 and 52 are isolated from the circuit substrate. Such configuration is used so that a high Vtt value does not place a high voltage between the source and bulk terminals of either transistor. In this manner, the Vtt voltage is distributed evenly, or approximately evenly, among transistors 50, 52 and 54. Thus, the three thin-oxide transistors of FIG. 6 can be used in lieu of one or more thick-oxide devices that would provide similar performance, the use of thin-oxide devices being preferable due to the reduced area they require relative to a comparably performing thick-oxide configuration.

The operation of the FIG. 6 circuit is analogous to the operation of the FIG. 2 circuit. As in the FIG. 2 embodiment, the circuit of FIG. 6 may be incorporated within an integrated circuit chip. Referring to FIG. 6, in the steady state, capacitor 64 is charged to a voltage of Vtt. In this state, the input of each inverter is high, so the output of each inverter is low, that is, the gates of transistors 50, 52, and 54 are at or near their respective source voltages. Therefore, each of transistors 50, 52 and 54 are off and an open circuit appears between the drain of transistor 50 and the source of transistor 54.

When the chip is powered-down, capacitor 64 is discharged. Accordingly, during an ESD, the inverter inputs are low, and the output of each of inverters 56-60 is "high," that is, near the Vtt voltage. Thus, transistors 50-54 are on, providing a low-impedance conduction path from the Vtt terminal to ground. In this state, any charge associated with an ESD event on the Vtt terminal is shunted to ground by transistors 50-54. There is little or no charging of the capacitor 64 during the ESD event, a condition which is insured by use of a resistor 62 and capacitor 64 that have an "rc time constant" that is much greater than the duration of the average ESD event.

When the chip is powered-on, the capacitor 64 begins to charge. The rc time constant of resistor 62 and capacitor 64 is shorter than the time required for a typical power supply to bring the Vtt voltage to its full value, so the voltage at node 63 is substantially equal to the voltage on Vtt. As the capacitor charges, the voltage on the inputs of inverters 56, 58, and 60 goes high, and their respective outputs are low, such that the gates of transistors 50, 52, and 54 are at or near their respective source voltages. Therefore, the circuit's steady state has little or no current conduction between Vtt and ground. Resistors 72 are included to ensure that the voltage at node 66 is at or near Vtt/3 and the voltage at node 65 is at or near 2/3*Vtt, thereby causing the voltage drop between drain and source of each of transistors 50-54 to be approximately Vtt/3.

It should be noted that in some embodiments, each of inverters 56, 58 and 60 are of the same form as inverter 14 of FIG. 2. More specifically, in such embodiments, each of inverters 56, 58 and 60 takes the form of one inverting-input FET (PFET) and one non-inverting-input FET (NFET) coupled together as shown in element 14 of FIG. 2. In such embodiments, all the inverter FETs depicted are thick-oxide devices.

It should be further noted that in the preferred embodiment, each of transistors 50-54 is an NFET of the type shown as transistors 18 and 20 in FIG. 3. In such embodiment, transistors 50-54 would be formed on a single p-type substrate, and transistors 50 and 52 would be positioned within a deep n-well, or within two separate deep n-wells.

As these and other variations and combinations of the features discussed above can be utilized without departing from the present invention as defined by the claims, the foregoing description of the preferred embodiments should be taken by way of illustration rather than by way of limitation of the invention as defined by the claims.

The invention claimed is:

1. A power supply shunt, comprising:

Field Effect Transistors (FETs), a first of said FETs having its drain coupled to a terminal of an electronic circuit and its source coupled to another of said FETs, and a second of said FETs having its source coupled to ground and its drain coupled to another of said FETs;

first and second inverter circuits, wherein outputs of the first inverter circuit are coupled to a gate and the source of the first of said FETs, and wherein an output of the second inverter circuit is coupled to a gate of the second of said FETs; and a capacitor coupled to inputs of the first and the second inverter circuits.

2. The power supply shunt as claimed in claim 1, wherein the power supply shunt is disposed on a grounded p-type substrate and the first FET bulk terminal is isolated from the grounded p-type substrate.

3. The power supply shunt as claimed in claim 1, wherein the first FET is an n-channel FET positioned within a deep n-well that is formed in a p-type substrate.

4. The power supply shunt as claimed in claim 1, wherein the first FET is an n-channel FET having a bulk terminal in the form of a p-well that is positioned within an n-type substrate.

5. The power supply shunt as claimed in claim 1, wherein the first and second FETs have an oxide layer of thickness that is approximately 20 angstroms or less.

6. The power supply shunt as claimed in claim 1, further comprising:

a third inverter circuit, wherein a third of said FETs has a first terminal coupled to the first of said FETs and a second terminal coupled to the second of said FETs, wherein an output of the third inverter circuit is coupled to a gate of the third of said FETs, and wherein the capacitor is coupled to an input of the third inverter circuit.

7. The power supply shunt as claimed in claim 6, further comprising a resistor coupling the capacitor to the terminal wherein the rc time constant of the resistor and the capacitor is greater than the typical Electrostatic Discharge (ESD) event.

8. The power supply shunt as claimed in claim 1, further comprising a resistor network configured to apportion, in the steady state, a termination voltage applied to said terminal evenly, or substantially evenly, across drain-source paths of respective ones of the FETs.

9. A power supply shunt, comprising:

means for shunting charge imparted to a terminal of an electronic circuit by an ESD to ground including a plurality of FETs;

means for storing charge received from the terminal;

first means for inverting a signal from the means for shunting charge to generate a first inverted signal at a gate of a first FET of the plurality of FETs; and second means for inverting the signal from the means for shunting charge to generate a second inverted signal at a gate of a second FET of the plurality of FETs.

10. The power supply shunt as claimed in claim 9, wherein the first FET of the plurality of FETs is an n-channel FET, and the power supply shunt additionally comprises a p-type substrate and a deep n-well in the p-type substrate, within which the first FET is positioned.

11. The power supply shunt as claimed in claim 9, wherein the first FET of the plurality of FETs is an n-channel FET comprising a bulk terminal, and the power supply shunt additionally comprises a p-well that provides the bulk terminal of the first FET.

12. The power supply shunt as claimed in claim 9, wherein the FETs comprise an oxide layer that is approximately 20 angstroms thick.

13. The power supply shunt as claimed in claim 9, further comprising means for apportioning, in the steady state, a termination voltage applied to said terminal evenly, or substantially evenly, across drain-source paths of respective ones of the FETs.

14. A non-transitory information-bearing medium having non-transitory computer-readable information thereon, the non-transitory computer-readable information describing a power supply shunt comprising:

Field Effect Transistors (FETs), a first of the FETs having its drain coupled to a terminal of an electronic circuit and its source coupled to another of the FETs, and a second of the FETs having its source coupled to ground and its drain coupled to another of the FETs;

first and second inverter circuits, wherein an output of the first inverter circuit is coupled to a gate of the first of the FETs, wherein an output of the second inverter circuit is coupled to a gate of the second of the FETs, and wherein inputs of the first and the second inverter circuits are coupled to the terminal of the electronic circuit; and a capacitor coupled to the inputs of the first and the second inverter circuits.

15. The non-transitory information-bearing medium as claimed in claim 14, wherein the non-transitory computer-readable information is configured to actuate a circuit forming apparatus to form a cell of an integrated circuit, wherein the cell comprises the power supply shunt.

16. The information-bearing medium as claimed in claim 14, in which the non-transitory computer-readable information additionally describes a resistor network configured to apportion, in the steady state, a termination voltage applied to said terminal evenly, or substantially evenly, across drain-source paths of respective ones of the FETs.

17. An integrated circuit, comprising:

a substrate;

a power supply shunt including Field Effect Transistors (FETs), a first of the FETs having its drain coupled to a terminal of an electronic circuit, a second of the FETs having its source coupled to ground and its drain coupled to a third of the FETs, and wherein the source of the first of the FETs is coupled to the third of the FETs;

first, second, and third inverter circuits, wherein an output of the first inverter circuit is coupled to a gate of the first of the FETs, wherein an output of the second inverter circuit is coupled to a gate of the second of the FETs, and wherein an output of the third inverter circuit is coupled to a gate of the third of the FETs; and a capacitor coupled to inputs of the first, the second, and the third inverter circuits.

18. The integrated circuit as claimed in claim 17, wherein the substrate is a p-type substrate.

19. The integrated circuit as claimed in claim 17, wherein the substrate is a p-type substrate and comprises a deep n-well located therein; and the first FET is an n-channel FET positioned within the deep n-well.

20. The integrated circuit as claimed in claim 17, wherein the first FET is an n-channel FET comprising a bulk terminal; and the substrate is an n-type substrate comprising a p-well that provides the bulk terminal of the first FET.

21. The integrated circuit as claimed in claim 17, further comprising a resistor network configured to apportion, in the steady state, a termination voltage applied to said terminal evenly, or substantially evenly, across drain-source paths of respective ones of the FETs.

* * * * *